United States Patent
Manzur et al.

(10) Patent No.: US 9,570,487 B2
(45) Date of Patent: Feb. 14, 2017

(54) OPTICAL OUTPUT PHOTODETECTOR

(71) Applicant: University of Central Florida Research Foundation, Inc., Orlando, FL (US)

(72) Inventors: Tariq Manzur, Lincoln, RI (US); Aravinda Kar, Oviedo, FL (US)

(73) Assignees: The United States of America, Naval Undersea Warfare Center, Washington, DC (US); University of Central Florida Research Foundation, Inc., Orlando, FL (US)

(*) Notice: Subject to any disclaimer, the term of this patent is extended or adjusted under 35 U.S.C. 154(b) by 456 days.

(21) Appl. No.: 14/176,791

(22) Filed: Feb. 10, 2014

(65) Prior Publication Data

US 2014/0226022 A1 Aug. 14, 2014

Related U.S. Application Data

(60) Provisional application No. 61/763,261, filed on Feb. 11, 2013.

(51) Int. Cl.
   H01L 27/146 (2006.01)
   H01L 27/144 (2006.01)

(52) U.S. Cl.
   CPC ..... H01L 27/14601 (2013.01); H01L 27/1446 (2013.01); H01L 27/14603 (2013.01); H01L 27/14698 (2013.01)

(58) Field of Classification Search
   CPC ............... G06T 5/50; H01L 27/14601; H01L 27/14698; H04N 5/33
   USPC .......................................................... 348/56
   See application file for complete search history.

(56) References Cited

U.S. PATENT DOCUMENTS

| | | | |
|---|---|---|---|
| 6,411,377 B1* | 6/2002 | Noguchi | B82Y 15/00 356/237.4 |
| 2002/0133065 A1* | 9/2002 | Lucassen | A61B 5/0059 600/322 |
| 2003/0161249 A1* | 8/2003 | Kamisada | G11B 7/123 369/112.23 |
| 2006/0171284 A1* | 8/2006 | Matsumoto | G11B 7/0065 369/103 |
| 2007/0292803 A1* | 12/2007 | Matsumoto | B82Y 10/00 430/270.1 |
| 2010/0064396 A1* | 3/2010 | Nakata | G01Q 60/18 850/30 |
| 2010/0103490 A1* | 4/2010 | Noguchi | G03H 1/0486 359/30 |
| 2010/0330578 A1* | 12/2010 | Duhr | G01N 21/6408 435/6.11 |
| 2012/0051378 A1 | 3/2012 | Kar et al. | |
| 2012/0307035 A1* | 12/2012 | Yaqoob | G01B 9/04 348/79 |

(Continued)

Primary Examiner — Tung Vo
(74) Attorney, Agent, or Firm — Jetter & Associates, P.A.

(57) ABSTRACT

An optical output photodetector includes a substrate having a semiconductor surface and at least one optical photodetector element on the semiconductor surface. The optical photodetector element includes a plurality of integrated sensing regions which collectively provide a plurality of different absorbance spectra. The plurality of sensing regions includes a plurality of different semiconductor materials or a semiconductor material having a plurality of different dopants. The optical photodetector element can be configured as an array of optical photodetector elements and the dopants can be magnetic dopants.

11 Claims, 5 Drawing Sheets

(56) References Cited

U.S. PATENT DOCUMENTS

2013/0334186 A1* 12/2013 Nomaru ................. B23K 26/02
                                                    219/121.82
2014/0118524 A1*  5/2014 Munck ..................... G06T 5/50
                                                         348/79

* cited by examiner

OPTICAL OUTPUT PHOTODETECTOR

CROSS REFERENCE TO RELATED APPLICATIONS

This application claims the benefit of Provisional Application Ser. No. 61/763,261 entitled "WIDEBAND PHOTODETECTOR WITH OPTICAL READOUT", filed Feb. 11, 2013, which is herein incorporated by reference in its entirety.

STATEMENT REGARDING FEDERALLY SPONSORED RESEARCH

This invention was made with Government support under Agency contract No. N6660412P0054 awarded by Naval Undersea Warfare Center. The Government has certain rights in this invention.

FIELD

Disclosed embodiments relate to wideband or multi-band optical output photodetectors, and processes for forming the same.

BACKGROUND

Most conventional infrared (IR) detectors for remote sensing use electrical readouts, such as provided by microbolometers in which the resistivities of the pixel elements of the detector change based on temperature resulting from IR exposure. IR imaging with optical readouts is also known, such as using microcantilever or interferometric-based systems. Microcantilevers, in optical readout devices for thermal imaging, bend as their temperature is increased due to exposure to IR radiation, and thus the angle in which the light (usually visible light) is reflected changes as a function of temperature.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments provide optical output photodetectors (hereafter optical photodetectors) which include a substrate having a semiconductor surface, and at least one optical photodetector element on the semiconductor surface, and an array of such optical photodetector elements in certain embodiments. The optical photodetector element(s) includes a plurality of integrated sensing regions which collectively provide different absorbance spectra. As used herein, "integrated" sensing regions refer to sensing regions that are physically coupled to adjacent regions without any adhesive analogous to structures provided by conventional integrated circuit (IC) processing, such as vertically stacked, or laterally positioned relative to one another to provide a ring-shaped optical photodetector element.

The plurality of integrated sensing regions can include a plurality of different semiconductor materials or a semiconductor material having a plurality of different dopants. Disclosed optical photodetectors provide non-contact optical outputs which can be contrasted with conventional photodetectors which provide an electrical output and require a readout integrated circuit (ROIC) to be electrically connected to the photodetector to process the electrical current or voltage output of the photodetector.

When disclosed optical photodetector elements are referred to as being "broadband," the elements provide either wideband (i.e. a continuous band) or multi-band (i.e. a plurality of discrete bands) operation. The bandwidth of the continuous band is generally at least 5 nm (e.g., 100 to 500 nm wide) obtained from the combination of a plurality of different overlapping discrete absorbance bands. The plurality of discrete bands generally number at least 3 each having a bandwidth of at least 1 nm (e.g., each 50 nm to 125 nm wide).

Laser-based methods for forming disclosed optical photodetectors are also disclosed including laser-assisted deposition (LAD) and laser-assisted dopant incorporation (LADI) processes. In addition, optical photodetector systems are disclosed including embodiments with an array of disclosed optical photodetector elements, and sensing using such optical photodetector systems including polarization-based sensing, magnetic field-based sensing, gas sensing and pressure sensing.

DETAILED DESCRIPTION

Figure 1A:
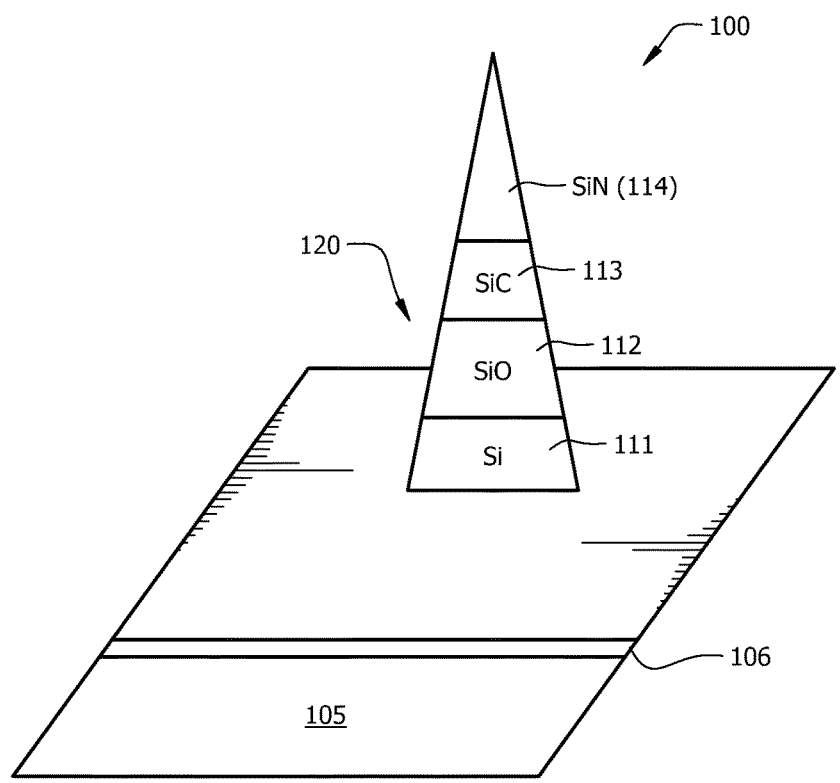
FIGS. 1A and 1B show perspective depictions of example optical photodetector element structures including a plurality of integrated sensing regions comprising multiple semiconductor materials on a semiconductor surface of a substrate, and multiple regions of a semiconductor material having different dopants on the semiconductor surface, respectively, according to example embodiments.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments.

One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

In one disclosed embodiment, a wideband (continuous band) or multi-band (discrete band) optical photodetector element including a plurality of integrated sensing regions is configured as a vertical structure(s) on a semiconductor surface of a substrate. This embodiment involves three-dimensional (3D) sensors/optical photodetector(s) built on a semiconductor surface that may be fabricated by a gas phase reaction process using LAD or LADI. LAD refers to a process for forming a pattern on a substrate by the use of a focused laser beam(s). Although disclosed optical photodetector elements may be described herein as being nanostructures (i.e., having at least one nanoscale dimension, and all nanoscale dimensions in one embodiment), disclosed optical photodetector elements may be larger than nanosize in one or more of its dimensions (e.g., micron-size).

The LAD process involves deposition of thin films or thin crystalline layers by heating the substrate with a laser beam in the presence of a film-forming chemical(s) or crystal-forming chemical(s). These chemicals, which are referred to as precursors, can exist in vapor (e.g., metallorganic compounds), liquid or solid form. Chemical reaction occurs due to thermal decomposition at the laser-heated spot and a thin layer of material is deposited on the substrate. The LAD process can also be subtractive (e.g., incorporate ablation, machining or chemical etching).

LADI refers to laser-assisted doping of an intrinsic semiconducting material. In the LADI process a dopant precursor (e.g., trimethyl gallium) is used. This precursor decomposes at the laser-heated spot forming the dopant atoms which subsequently diffuse into the layer deposited by the LAD process. The dopant atoms can also diffuse into the semiconductor substrate and become electrically active. These diffused dopant atoms attribute semiconductor properties to the material (by providing band gap acceptor or donor energy states) so that the resulting doped semiconductors can be used to fabricate disclosed optical photodetectors and sensors. Instead of carrying out the LAD and LADI processes sequentially, the LAD and LADI processes can be implemented simultaneously so that the deposited layer is doped as it is deposited (in situ doped).

Disclosed 3D optical photodetectors can be fabricated from gas phase reactions using LAD including using a single laser or multiple lasers in an array of lasers including a laser scanner or positioner that allows scanning the laser beam(s) over the semiconductor surface of a substrate (e.g., silicon wafer or SiC wafer) to form multiple optical photodetector elements which each function as pixels to provide an array of pixels. The small size of the laser spot(s) provided by highly coherent lasers allows nanoscale optical photodetector dimensions to be obtained.

The laser (or laser array) can create conical, pyramidal or other 3D shapes for the optical photodetector comprising multiple material compositions by using a suitable laser scan pattern. FIG. 1A shows a perspective depiction of example optical photodetector 100 comprising an optical photodetector element 120 including a plurality of integrated sensing regions having multiple semiconductor materials on a semiconductor surface, shown as a substrate 105 having a silicon surface 106, such as provided by a bulk silicon wafer. However, the semiconductor surface need not be the same material as the substrate, including one embodiment where the substrate is a dielectric material (e.g., silicon on insulator).

Figure 1B:
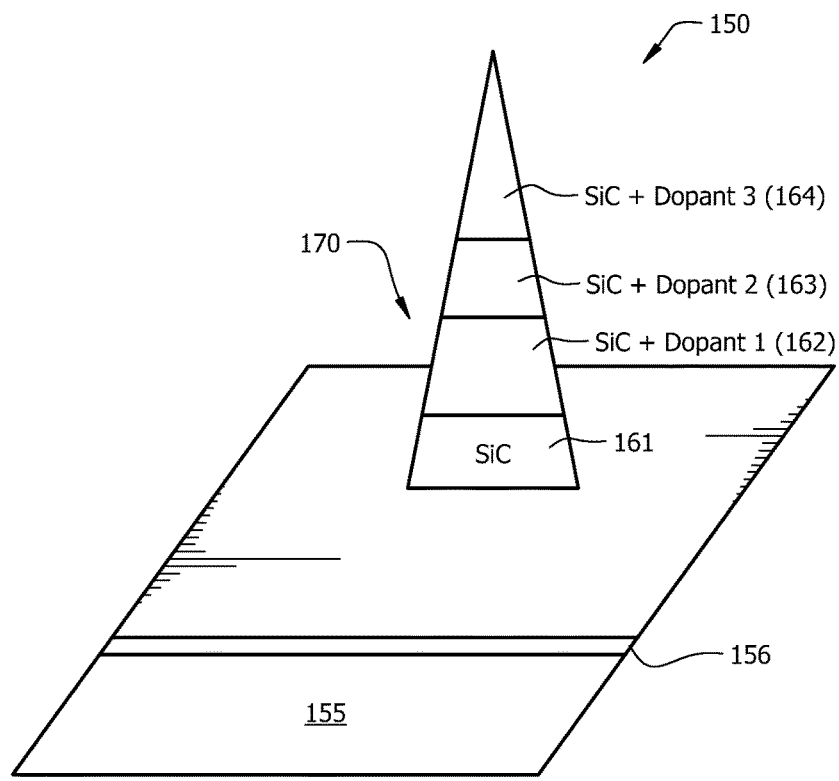

The example integrated sensing regions having different materials shown in FIG. 1A are SiN region 114 on SiC region 113 on SiO region 112, on Si region 111 provided by a portion of the silicon surface 106 on the substrate 105, where regions 112-114 may alternatively be stacked in any order. The top of the Si region 111 is generally flush with the top side of the silicon surface 106. FIG. 1B shows a perspective depiction of example optical photodetector structure 150 comprising an optical photodetector element 170 including a plurality of integrated sensing regions having multiple regions of a doped SiC semiconductor material having different dopants stacked on a SiC surface 156 on a SiC substrate 155. The stack is shown having doped regions including region 164 comprising SiC+dopant 3, region 163 comprising SiC+dopant 2, region 162 comprising SiC+dopant 1 on region 161 comprising SiC on a SiC substrate, where regions 162-164 may alternatively be stacked in any order. The top of the SiC region 161 is generally flush with the top side of the SiC surface 156.

Doping is a common term used in semiconductor processing describing a process where impurity atoms having one or more energy states in the bandgap of the semiconductor being doped are intentionally introduced (e.g., via ion implantation) into selected regions of a semiconductor crystal for the purpose of modulating its electrical properties. For Group IV semiconductors such as silicon, germanium, and SiC, the most common dopants are electron acceptors from Group III elements (e.g., B, Al or Ga) and electron donors from Group V elements (P, As, or Sb). Disclosed embodiments recognize that semiconductor doping can also change the absorptive properties of the semiconductor material, including shifting the absorption spectrum to provide detection for new peaks, where the new peak(s) provided is defined by the energy difference between the dopant energy level and the valence band energy level for acceptor dopants or conduction band energy level for donor dopants provided by the semiconductor material. Other embodiments described below introduce magnetic dopants which include magnetic atoms that have unpaired electron spins.

For example, for forming SiC-based optical photodetector structures, silane can be used as the Si-precursor, light hydrocarbons, e.g., propane ($C_3H_8$) or ethylene ($C_2H_4$), as the C-precursor, hydrogen ($H_2$) as the carrier gas, and a dopant gas may be used, together with a laser (or laser array)

for ablation that can create conical, pyramidal or other 3D shapes for the optical photodetector comprising a semiconductor material with multiple dopant materials by using a suitable laser pattern. For example, region 162 containing dopant 1 can be formed in a first time interval, then region 163 containing dopant 2 can be formed in a second time interval, then region 164 containing dopant 3 can be formed in a third time interval, etc. A typical dopant concentration range is $10^{16}$ atoms/cm$^3$ to $10^{18}$ atoms/cm$^3$, such as around $10^{17}$ atoms/cm$^3$.

The optical photodetector in FIG. 1B can be an epitaxial article. However, an epitaxial article is not necessary.

An optical photodetector element having integrated sensing regions that provide a material combination (optical photodetector element 120 in FIG. 1A) and/or doping combination (optical photodetector element 170 in FIG. 1B) provides different absorption spectra which enhance collection efficiency and allows the optical photodetector element to absorb a wide range of wavelengths, i.e., broadband detection. The center of the operable band of the optical photodetector element may be designed to be in the infrared (IR), such as at a center wavelength from 3 µm to 12 µm, or be in other bands (e.g., microwave). As described above, continuous band operation can be provided by the overlap of the bandwidth of a plurality of bands, such as obtained by utilizing integrated sensing regions having different dopants (optical photodetector element 170 in FIG. 1B). A plurality of discrete narrow bands is also possible by selecting various dopants that provide sparsely spaced bandgap dopant energy levels that do not overlap.

The broadband nature of disclosed optical photodetectors, when implemented in an array as in a focal plane array (FPA) detector, provides enhanced detectivity and lower noise equivalent temperature difference (NETD). This is because the optical photodetector's bandwidth is the basis for the magnitude of photodetector noise, and the value of directivity varies in proportion to the square root of noise bandwidth, while the NETD is inversely proportional to it.

The NETD, however, can be further improved by adding a grating in front of the wideband optical photodetector array to direct the incident photons to the optical photodetector element(s) which functions as a pixel(s) more efficiently. Also digital imaging, such as Digital Signal Processing (DSP), can be implemented to correct the pixel values that are created in a computer (e.g., processor) based on the power of the probe light reflected off the optical photodetector element, such as provided by laser 435 and detected by laser beam photodetector 437 described below relative to FIG. 4A. Disclosed 3D vertical optical photodetectors such as shown in FIGS. 1A and 1B also act as a photon trapping device taking the place of an antireflection (AR) coating to absorb a large percentage of the incoming radiation. Needles (or other 3D shapes) can be formed to follow (point in) the direction of laser light (or other radiation) for 3D optical photodetector detection.

A ring-shaped optical photodetector device may also be fabricated using LADI to comprise multiple rings stacked on one another, including rings each with different dopants for multi-wavelength detection. In this embodiment, the optical photodetector element including a plurality of integrated sensing regions is configured as one or more 3D ring-shaped structures on a semiconductor surface.

Figure 2A:
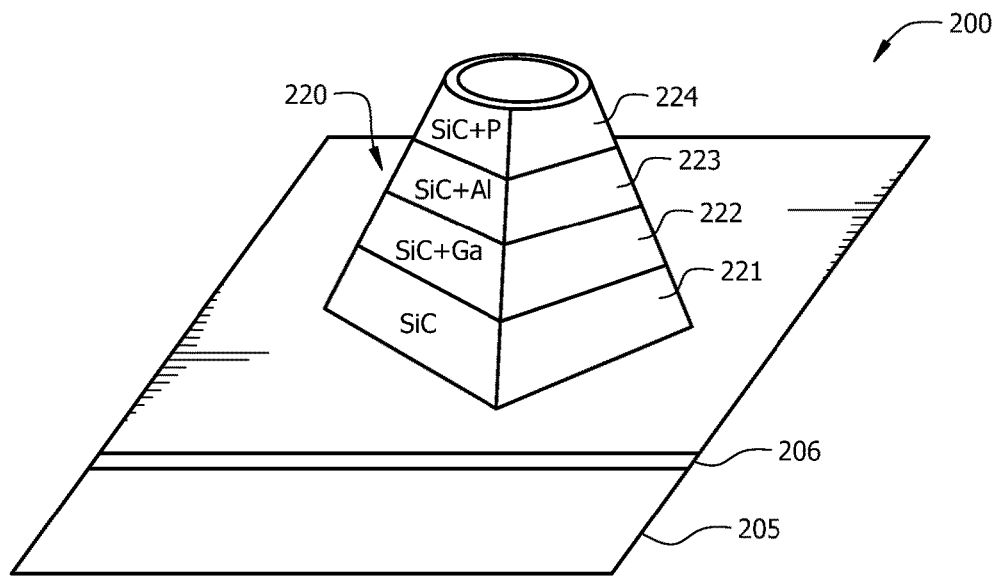
FIG. 2A shows a perspective depiction of an example ring-shaped optical photodetector element including a plurality of integrated sensing regions having different dopants for multi-wavelength detection, according to an example embodiment.
Figure 2B:
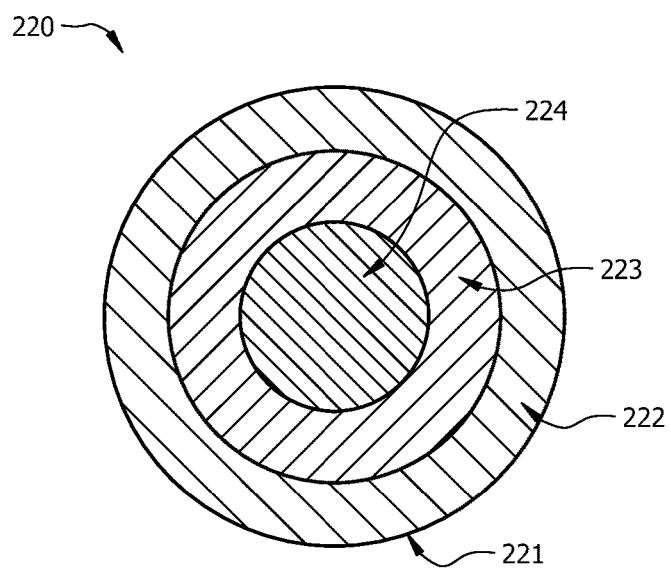
FIG. 2B is a top view depiction of the example ring-shaped optical photodetector element including integrated sensing regions having different dopants shown in FIG. 2A.

An example optical photodetector structure 200 including a ringed 3D optical photodetector element 220 on a SiC surface 206 of a SiC substrate 205 is shown in the perspective view of FIG. 2A and top view of FIG. 2B. The ring is shown having integrated doped sensing regions including sensing region 224 comprising SiC+phosphorous (P) dopants, sensing region 223 comprising SiC+Al dopants, sensing region 222 comprising SiC+Ga dopants and sensing region 221 comprising a portion of the SiC surface 206 on the SiC substrate, where sensing regions 222-224 may alternatively be stacked in any order. The top of the SiC sensing region 221 is generally flush with the top side of the SiC surface 206.

Figure 3:
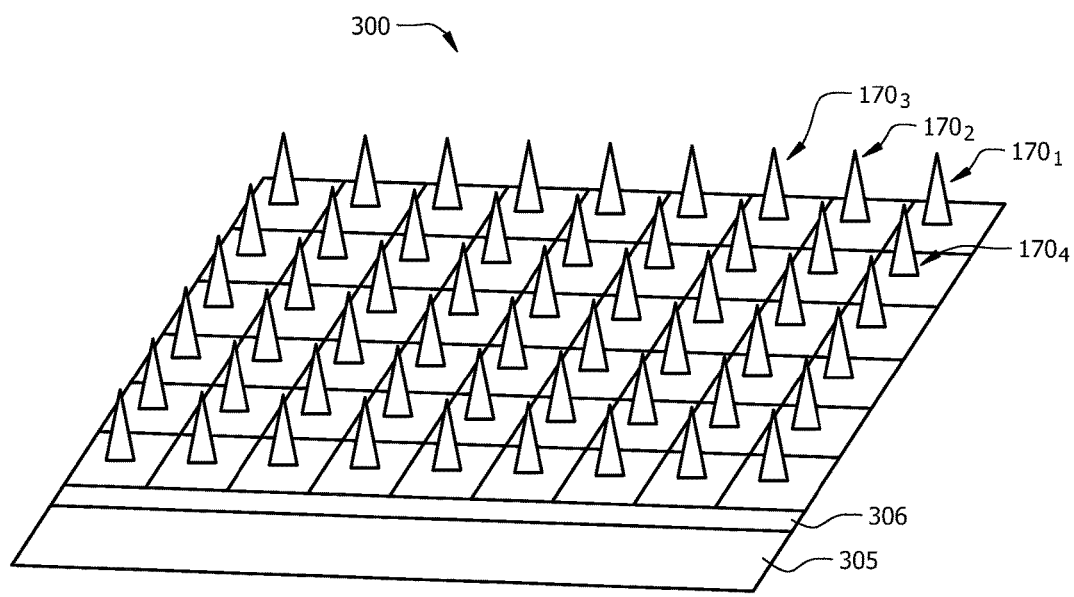
FIG. 3 shows a perspective depiction of an array of optical photodetector elements lateral to one another on the surface of a semiconductor (e.g., silicon) wafer, according to an example embodiment.

The plurality of the optical photodetector regions shown in FIGS. 1A and 1B may also be formed lateral to one another on a semiconductor surface, and may optionally be nanoscale optical photodetectors having one or more nanoscale dimensions. In another example, as shown in FIG. 3, an array 300 of optical photodetector elements 170 in FIG. 1B now shown as $170_1$, $170_2$, $170_3$, $170_4$ lateral to one another are provided on a semiconductor surface 306 of a substrate 305 [e.g., a SiC wafer which provides the semiconductor (SiC) surface 306 and (SiC) substrate 305] each having different dopant species. Array 300 may be fabricated to operate over wide range of wavelengths, from which a FPA may be developed. Each optical photodetector element $170_1$, $170_2$, $170_3$, $170_4$ provides a pixel for the array 300.

The horizontal and vertical grid lines shown in FIG. 3 represent an electrical isolation structure between optical photodetector elements such as $170_1$, $170_2$, $170_3$, $170_4$ shown in FIG. 3 for preventing electrons generated in one optical photodetector element when the electron density changes in that optical photodetector element responsive to incident light, gas or pressure (for piezoelectric substrates) from flowing into a neighboring optical photodetector element. The isolation can comprise scribe lines which create surface recesses, or a surface dielectric layer, such as an oxide (e.g., silicon oxide) or nitride (e.g., silicon nitride) layer.

Figure 4A:
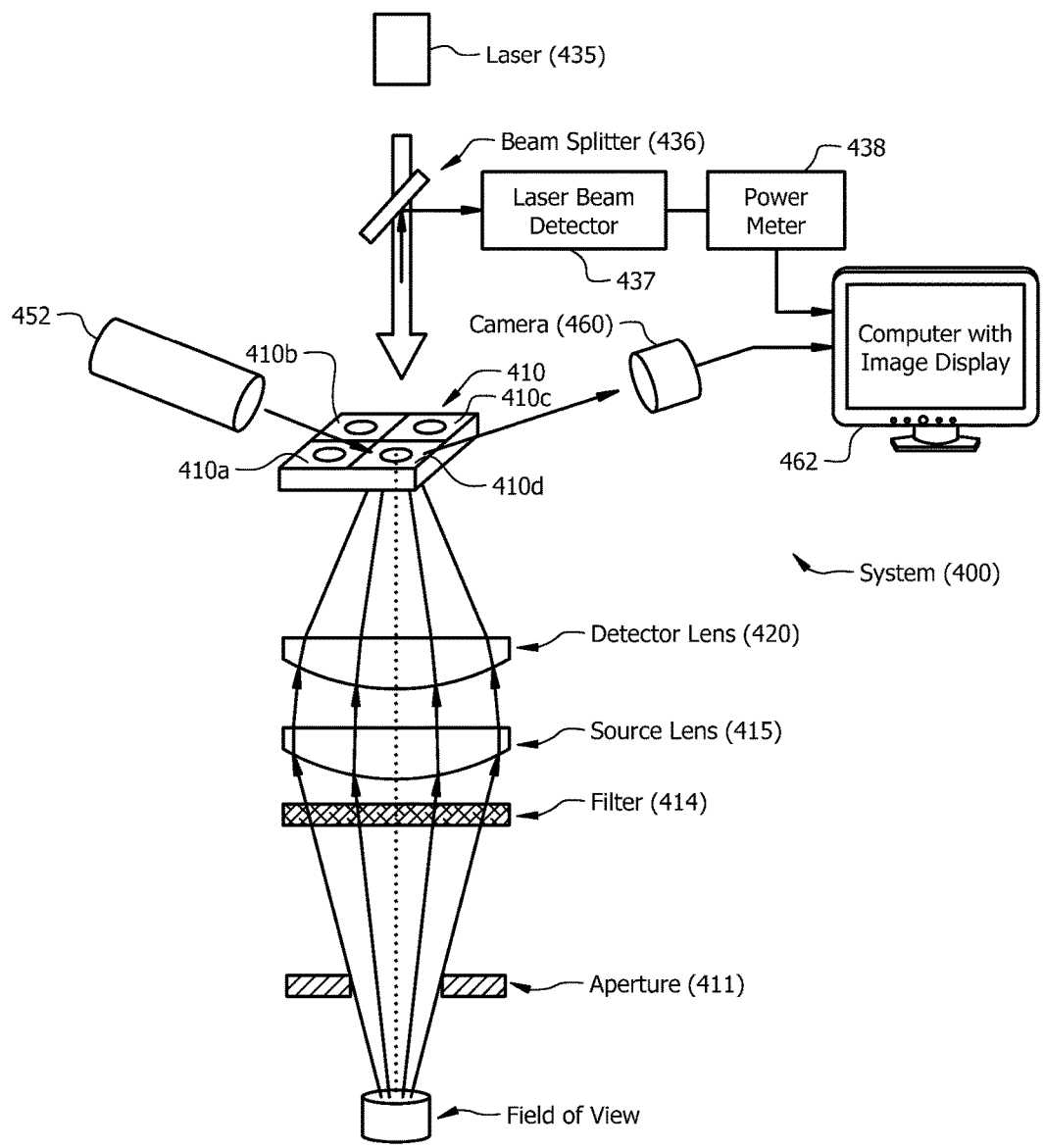
FIG. 4A shows a depiction of an example broadband optical readout system including a disclosed optical photodetector comprising a substrate with doped quadrants thereon illustrating a 2×2 array of optical photodetector elements, according to an example embodiment.

FIG. 4A shows a depiction of an example broadband optical readout system 400 including an optical photodetector array 410 comprising a substrate with doped optical photodetector elements 410a, 410b, 410c and 410d, thereon illustrating a 2×2 array of optical photodetector elements, according to an example embodiment. The darkened areas in the respective elements correspond to the optical photodetector elements including a plurality of integrated sensing regions. The optical photodetector array 410 does not require cooling and can operate at room temperature (e.g., 25° C.).

For reflectance measurement, a laser 435 (e.g., He—Ne laser of wavelength 632.8 nm) is incident on the optical photodetector array 410 at 0° angle of incidence (relative to the surface normal). The reflected power may be measured with a laser beam photodetector 437 (e.g., Si-based photodetector, having an electrical signal output) and an associated power meter 438 whose output is coupled to computer 462 which provides a reflectance measurement. A change in refractive index of the optical photodetector elements 410a, 410b, 410c and 410d results in a change in reflectivity that can be sensed by irradiation by a laser beam (probe light) from laser 435 and detection by laser beam photodetector 437 after beam splitting by beam splitter 436. As noted above, the power of the probe light provided by laser 435 reflected off the optical photodetector elements can be used to correct the pixel values that are generated by the computer 462. The correction method involves digital signal processing (DSP) technology in which the threshold and background pixel values are updated, dead pixels are revived and labeling is modified through averaging and interpolation of pixel values.

The optical photodetector elements 410a, 410b, 410c and 410d are generally each doped differently, which can be used to create a FPA detector. For imaging applications, the optical photodetector array 410 can be irradiated with an incoherent light beam from an incoherent light source 452, such as incoherent light from a light-emitting diode (LED). The incoherent light that is reflected off the optical photodetector array 410 can be viewed by the camera 460 shown, such as a charge-coupled device (CCD) camera, connected to a computer 462 that includes an image display. The relative intensities of the reflected light in various pixels of the camera 460 can be analyzed to generate computer-enhanced digital images, such as by using DSP algorithms.

System 400 is shown including optics for imaging a field of view (FOV) or otherwise more generally providing focused incident radiation to the optical photodetector array 410 (e.g., for pressure sensing or gas sensing as described below). An aperture 411, bandpass filter 414, and source lens 415 collects photons from the FOV (field of interest) and the detector lens 420 then focuses the photons from the FOV to the optical photodetector array 410, shown in FIG. 4A directed to optical photodetector element 410d. However, the optics for imaging the FOV in system 400 can be configured to simultaneously direct photons to two or more of the optical photodetector elements 410a, 410b, 410c and 410d to increase the sensing bandwidth.

Since the optical photodetector array 410 can operate over a broad range of wavelengths, the bandpass filter 414 is generally selected to provide a narrow bandwidth to select the particular wavelength of interest. This selectivity of wavelength using an optical filter such as bandpass filter 414 can also reduce the photodetector noise. If photons of a broad wavelength range are incident on the optical photodetector array 410 simultaneously, their interactions with the electrons can lead to various noise mechanisms.

In another embodiment, a wideband optical photodetector is configured as an array of broadband optical photodetector elements including different spectral ranges such as microwave, THz, and IR bands (e.g., SWIR, MWIR and LWIR): In this embodiment, a semiconductor surface such as SiC or other semiconductor material (e.g., Si, Ge, GaN, GaAs, InP) includes magnetic dopant atoms therein, such as Co, Mn, Ni in a concentration to create sufficient spin states (electronic spin energy level) in the semiconductor material to allow detection of the spin states. A typical concentration range to create sufficient spin states to allow detection for magnetic dopants is $10^{16}$ atoms/cm$^3$ to $10^{18}$ atoms/cm$^3$, such as around $10^{17}$ atoms/cm$^3$. These spin states are aligned using a magnetic field, which can be a static magnetic field or a time-varying magnetic field including an oscillating magnetic field. When a static magnetic field ($B_0$) is applied, such as by a permanent magnet, the electron, or equivalently the magnetic moment, precesses about the axis that represents the direction of the applied magnetic field. This motion is known as the Larmor precession and the frequency of the motion is called the Larmor frequency, $\omega_0$, which is given by:

$$\omega_0 = g_e \frac{q}{2m_e} B_0 \quad (1)$$

where $g_e$=2.0023 is the free electron g-factor, q is the charge of an electron and $m_e$ is the rest mass of an electron. $\omega_0$ can be varied by changing $B_0$ so that photons of a particular wavelength, which are incident on the array of optical photodetector elements from the field of interest, can be preferentially absorbed. For example, a magnetic field of 0.1T (i.e., on the scale of one produced in a laboratory) corresponds to a frequency $\omega_0$=1.1×10$^{11}$ rad/s; and a magnetic field of 0.5T corresponds to $\omega_0$=5.5×10$^{11}$ rad/s. These two frequencies are in resonance with photons of wavelengths $\lambda$=17.1 mm and $\lambda$=3.42 mm, respectively, indicating that the optical photodetector can operate in the mm-wave or THz range.

This absorption of magnetic energy increases the energy of the precessing electrons and, therefore, the number density of electrons ($N_e$) in the higher energy state increases, which can measurably change the refractive index of the magnetically doped optical photodetector elements. Consequently the reflectivity and reflectance of the optical photodetector surface is modified. The change in the reflectance can be measured with a probe light, which can be a laser beam from a diode laser or another laser such as a He—Ne laser, or a light beam from a LED, as an optical signal of the optical photodetector. Optionally, the incident light beam, which is reflected off the optical photodetector element(s), can be directed to a camera 460 to produce an image of the field of interest (field of view).

How the photoexcitation of the precessing electrons affects the refractive index of a material can be understood by considering the magnetic susceptibility arising due to the interaction between the electrons and the electromagnetic field of the photons that are incident on the optical photodetector element(s). Due to this interaction, the complex susceptibility ($\chi$) of the magnetically doped material is given by:

$$\chi = \chi' - j\chi'' \quad (2)$$
$$= \chi_0 \omega_0 T_2 \frac{(\omega_0 - \omega)T_2}{1 + (\omega_0 - \omega)^2 T_2^2} - j\chi_0 \omega_0 T_2 \frac{1}{1 + (\omega_0 - \omega)^2 T_2^2}$$

where the real part ($\chi'$) and imaginary part ($\chi''$) represent the dispersive and absorptive responses of the magnetically doped material when the electromagnetic field of the incident photons interacts with the magnetic moment or magnetism of the optical photodetector element(s). Here $\chi_0$ is the static magnetic susceptibility, $T_2$ is the spin-spin relaxation time of the photoexcited electrons, $\omega$ is the frequency of the incident electromagnetic field and j is the imaginary number given by i=$\sqrt{-1}$. The spin-lattice relaxation time of the electrons can also be considered to obtain an expression for $\chi$ similar to Eq. (2). Now the relative permeability ($\mu_r$) and refractive index (n) are given by:

$$\mu_r = 1 + \chi' - j\chi'' \quad (3)$$

$$n = \sqrt{\epsilon_r \mu_r} \quad (4)$$

Eqs. (2), (3) and (4) show how the refractive index depends on the magnetic susceptibility and how $\chi$ can be varied by changing the magnetic field since $B_0$ affects $\omega_0$ as shown in Eq. (1). Also Eq. (2) shows that the absorption of photons is maximum when $\omega_0 = \omega$. Thus the magnetic field $B_0$ can be varied to create different Larmor frequencies (i.e., different values of $\omega_0$) for detecting photons of different frequencies.

Disclosed magnetic dopant-based optical photodetection thus provides a new mechanism to enable broadband optical photodetectors. Since small amounts of energy can excite the electrons in their spin state (i.e., spin energy levels), photons of very long wavelengths (e.g., microwaves and THz waves) can be detected by a magnetic dopant-based optical photodetector. The magnetic dopant-based optical photodetector can also be used to detect magnetic fields, such as the magnetic field of the earth, by applying pulsed magnetic fields (i.e., pulsed $B_0$) to the optical photodetector. When the pulse is off, the precessing electrons will decay to their normal state differently for different strengths of the ambient magnetic field. This decay will be manifested as a time-varying reflectance, and the magnitude of the reflectance, which can be measured with a probe light beam, will depend on the ambient magnetic field strength enabling detection of the field.

Figure 4B:
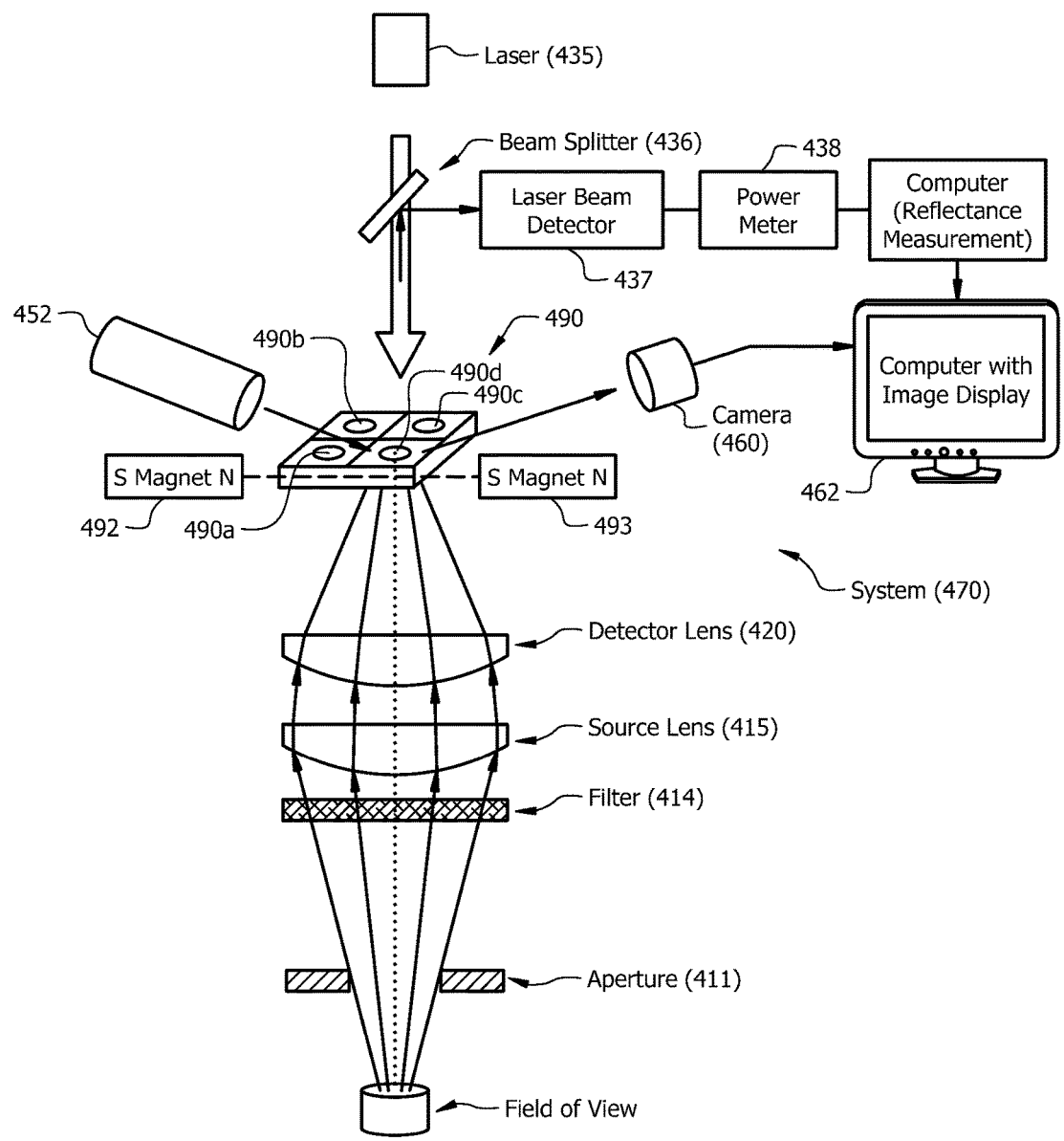
FIG. 4B shows a depiction of an example broadband optical readout system including an optical photodetector comprising a substrate with four quadrants (or pixels) that are magnetically doped thereon illustrating a 2×2 array of optical photodetector elements, according to another example embodiment.

FIG. 4B is a depiction of an example broadband optical photodetector system 470 based on electron precession energy which includes the same system features shown in FIG. 4A except the optical photodetector array 410 is replaced by optical photodetector array 490 having magnetic doping, along with B field source shown as magnets 492 and 493 for providing the B field shown in FIG. 4B to that allow electron processing energy to be measured.

The optical photodetector elements 490a, 490b, 490c and 490d are each doped with magnetic dopants differently and illustrate a 2×2 array of magnetically doped optical photodetector elements. Multiple optical photodetector elements of the optical photodetector array 490 can be doped differently with magnetic dopants to create a FPA detector. For imaging applications, the optical photodetector array 490 can be irradiated with an incoherent light beam to form incoherent light source 452, such a LED. The light that is reflected off the optical photodetector array 490 can be viewed with the camera 460 connected to a computer 462 having an image display.

Another disclosed embodiment comprises optical photodetection using polarization. In this embodiment, the probe light beam (e.g., He—Ne laser or LED generated light) as well as the incident electromagnetic (EM) wave, which is to be detected, both have polarizations. The waves can have various types of polarizations such as linear, circular, elliptic and helical polarizations. The effect of the polarization of the incident EM wave which is to be detected, on the changes in the refractive indices, reflectivities and reflectances, can be utilized to detect such waves. Also the effect of the changes in the refractive indices, reflectivities and reflectances on the polarization of the probe beam can be utilized to detect photons in various wavelength ranges.

Another disclosed embodiment comprises static magnetic field detection which can be realized using system 470 shown in FIG. 4B. In this embodiment, for detecting THz or long wavelength (EM) waves, the electron spins are stratified by applying a static magnetic field to the optical photodetector and the dynamic (i.e., time-varying) magnetic field of the EM wave is utilized to disturb the stratified energy state of the electron spin.

For detecting static magnetic fields, two example approaches are described. In one static magnetic field detection embodiment, the static magnetic field, which is to be detected, stratifies the electron spin and a short magnetic pulse or a time-varying magnetic wave is applied to the detector. This external magnetic field will disturb the stratified electron spins, modifying their energy level resulting in changes in the refractive indices, reflectivities and reflectances of the detector. These changes can be measured with a probe light beam to detect the static magnetic field.

In a second static magnetic field detection embodiment, the static magnetic field, which is to be detected, stratifies the electron spins. The polarization of the probe light beam can change depending on the degree of stratification and the direction of stratification. This change in the polarization can be utilized for detection and imaging applications. The optical photodetector can also be turned in the presence of the static magnetic field to achieve various degrees of stratification and various directions of stratification. With appropriate calibration, the changes in the reflected power of the probe light beam as well as the changes in the polarization of the probe light beam can be utilized for detection and imaging applications.

Another embodiment comprises a broadband detector based on the spectral response band of the optical photodetector which can be realized using system 400 shown in FIG. 4A. It is known that a p-type dopant creates an acceptor energy level within the bandgap of a semiconductor material. The same semiconductor material can be doped with at least one other p-type dopant to create an acceptor energy level adjacent to the other energy level of the previous dopant. Accordingly, by doping the semiconductor material with multiple dopants of closely spaced energy levels or by doping the semiconductor material with dopants in large concentrations (e.g., $10^{18}$ atoms/cm$^3$), a broadband acceptor level can be created in the semiconductor, which will make it a broadband detector. Photons of a particular wavelength can be detected by placing an appropriate bandpass filter in front of the optical photodetector so that photons of only the wavelength of interest are incident on the optical photodetector.

Another embodiment comprises a gas sensor which can be realized using system 400 shown in FIG. 4A. In this embodiment the optical readout feature, which replaces the readout integrated circuit (ROIC) of conventional electrical signal-based sensors, can be utilized to produce gas sensors. The detection mechanism of this type of gas sensor is based on the fact that all gases emit radiation with characteristic emission spectra. Different semiconductor surfaces, such as Si, Ge, SiC and GaN, can be doped with an appropriate dopant to create an energy level so that the energy gap ($\Delta E$) between the acceptor level and the valence band in the case of p-type dopant, or the conduction band and the donor level in the case of n-type dopant, corresponds to an individual photon energy of the characteristic emission spectral line, i.e., $\Delta E = h\nu$, where h is Planck's constant and $\nu$ is the frequency of the incident radiation that is to be detected. When photons are incident on the optical photodetector, they will excite electrons from the valence band to the acceptor level in the case of p-type dopant, or from the donor level to the conduction band in the case of n-type dopant, creating a variation in the distribution of electron density in various energy levels. Consequently the refractive index of the detector is modified, resulting in changes in the reflectivity and reflectance of the optical photodetector. This change in the reflectance can be measured with a probe light beam to detect a particular gas.

The gas sensor can be operated in two modes: passive mode and active mode. In the passive mode, the sensor receives the electromagnetic radiation that is naturally emitted by the gas. In the active mode, in contrast, the gaseous molecules are excited by shining a light beam, such as a laser beam, on the molecules so that they emit electromagnetic radiation of a predetermined wavelength. The intensity of the incident light beam can be varied to increase the intensity of the radiation emitted by the gas. Thus the active mode sensor enables detecting the presence of lower amounts of gases than the passive mode sensor.

Another embodiment disclosed comprises a pressure sensor which can be realized using system 400 shown in FIG. 4A. In this embodiment the optical readout feature can also be utilized to produce pressure sensors. Semiconductor materials such as Ge, Te, ZnSe, GaAs and piezoelectric materials with non-zero stress-optic coefficients can be used to fabricate pressure sensors. Since the gas pressure or mechanical stress on such substrates changes the refractive index of the material, the resulting change in the reflectance can be measured with a probe light beam, such as from laser 435 described above. In the case of gas pressure sensing, two example embodiments are disclosed herein. In one pressure sensor embodiment, the gas is in contact with the optical photodetector element(s)/sensor(s) to apply pressure to the optical photodetector element(s)/sensor(s).

In the second pressure sensor embodiment, the gas can be present some distance away from the sensor and the doped optical photodetector will act as a remote sensor to provide an optical detection signal [i.e., changes in the reflectance ($\Delta R$) of the optical photodetector] when the electromagnetic radiation, which is emitted by the gas, is incident on the optical photodetector/sensor. The remote pressure sensing application of disclosed optical photodetectors is enabled by all gases emitting radiations with characteristic emission spectra, and that the intensity of the emitted radiation depends on the partial pressure (p) and mole fraction ($M_f$) in the case of gaseous mixtures, and temperature (T) of the gas. Since $\Delta R$ is a function of p, $M_f$ and T, i.e., $\Delta R = f(p, M_f, T)$, three optical signals of the sensor can be measured corresponding to three different characteristic wavelengths in the emission spectra of the gas. Using these three values of $\Delta R$ and knowing the dependence of the spectral intensities (spectral emission peaks) on p, $M_f$ and T, the pressure, mole fraction and temperature of the gas can be determined.

The pressure sensor can likewise be operated in passive and active modes. In the passive mode, the sensor receives the electromagnetic radiation that is naturally emitted by the gas. In the active mode, on the other hand, the gaseous molecules are excited by shining a light beam, such as a laser beam, on the molecules so that they emit electromagnetic radiation of a predetermined wavelength. The intensity of the shining light beam can be varied to increase the intensity of the radiation emitted by the gas. Thus, the active mode sensor enables detecting lower pressures, lower mole fractions and lower temperatures of gases than the passive mode sensor.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. An optical output photodetector system, comprising:
   an optical photodetector, including:
     a substrate having a semiconductor surface, and at least one optical photodetector element on said semiconductor surface, wherein said optical photodetector element includes:
       a plurality of integrated sensing regions which collectively provide a plurality of different absorbance spectra,
       wherein said plurality of sensing regions include a plurality of different semiconductor materials or a semiconductor material having a plurality of different dopants,
   optics configured for providing focused incident radiation to said optical photodetector element;
   a laser for providing a first light beam incident on a beam splitter which provides a transmitted portion of said first light beam onto said plurality of sensing regions,
   a beam detector coupled to receive a reflected beam after said transmitted portion of said first light beam is reflected by said plurality of sensing regions then by said beam splitter, said beam detector electrically coupled to a power meter;
   a second light source for providing a second light beam incident on said plurality of sensing regions,
   a camera for detecting said second light beam after being reflected by said optical photodetector element, and
   a computer coupled to receive an output from said power meter and an output from said camera, said computer generating image data from detection of at least one physical parameter;
   wherein said at least one optical photodetector element comprises an array of said optical photodetector elements each having different dopants;
   wherein said optics configured for providing focused incident radiation comprises optics for imaging a field of view (FOV) including a bandpass filter, a source lens for collecting photons from said FOV, and a detector lens for focusing said photons to at least one of said array of said optical photodetector elements.

2. The system of claim 1, wherein said plurality of integrated sensing regions include said plurality of different semiconductor materials, and wherein said substrate is a first semiconductor material which provides said semiconductor surface, and wherein said plurality of different semiconductor materials include said first semiconductor material.

3. The system of claim 1, wherein said plurality of integrated sensing regions include said plurality of different dopants, wherein said plurality of different dopants comprise two or more different magnetic dopants.

4. The system of claim 1 wherein said plurality of integrated sensing regions are vertically stacked.

5. The system of claim 1, wherein said plurality of integrated sensing regions are positioned laterally relative to one another.

6. The system of claim 1, wherein said plurality of regions in said array of said optical photodetector elements include said plurality of different dopants, and wherein said different dopants comprise two or more different magnetic dopants.

7. A laser-based method for forming an optical output photodetector, comprising:
providing a substrate having a semiconductor surface;
forming at least one optical photodetector element including at least one pixel on said semiconductor surface with laser assistance, wherein said laser assistance comprises:
laser-assisted deposition (LAD) to form at least one deposited layer by heating said semiconductor surface with a laser beam in a presence of a film-forming chemical precursor to cause a chemical reaction due to a thermal decomposition of said chemical precursor at first laser-heated spots, or
laser-assisted dopant incorporation (LADI) using a chemical dopant precursor which decomposes at second laser-heated spots forming dopant atoms which diffuse into said deposited layer formed by said LAD,
wherein said deposited layer provides said pixel a plurality of integrated sensing regions which collectively provide a plurality of different absorbance spectra,
wherein for said LAD said plurality of integrated sensing regions include a plurality of different semiconductor materials or for said LADI said plurality of integrated sensing regions include a semiconductor material having a plurality of different dopants,
wherein in operation of said optical output photodetector said deposited layer of said pixel receives incident light that excites electrons from a valence band to an acceptor level in the case of a p-type dopant or from a donor level to a conduction band in the case of n-type dopant causing a variation in the reflectance of said pixel, and wherein said changes in the reflectance is measured with light from another light source which is incident on said pixel and reflected off said pixel which provides an optical output signal of said photodetector.

8. The method of claim 7, wherein said plurality of integrated sensing regions include said plurality of different dopants, wherein said plurality of different dopants comprise two or more different magnetic dopants.

9. The method of claim 7, wherein said plurality of integrated sensing regions are vertical stacked.

10. The method of claim 7, wherein said plurality of integrated sensing regions are positioned laterally relative to one another.

11. The method of claim 7, wherein said at least one optical photodetector element comprises an array of said optical photodetector elements each having different dopants.

* * * * *